(12) United States Patent
Akarvardar et al.

(10) Patent No.: US 9,716,174 B2
(45) Date of Patent: Jul. 25, 2017

(54) ELECTRICAL ISOLATION OF FINFET ACTIVE REGION BY SELECTIVE OXIDATION OF SACRIFICIAL LAYER

(71) Applicant: GLOBALFOUNDRIES Inc., Grand Cayman (KY)

(72) Inventors: Murat Kerem Akarvardar, Saratoga Springs, NY (US); Jody A. Fronheiser, Delmar, NY (US); Ajey Poovannummoottil Jacob, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 26 days.

(21) Appl. No.: 13/945,455

(22) Filed: Jul. 18, 2013

(65) Prior Publication Data

US 2015/0021691 A1  Jan. 22, 2015

(51) Int. Cl.
  *H01L 29/78* (2006.01)
  *H01L 29/66* (2006.01)
  *H01L 21/762* (2006.01)

(52) U.S. Cl.
  CPC ...... *H01L 29/785* (2013.01); *H01L 21/76224* (2013.01); *H01L 29/66795* (2013.01)

(58) Field of Classification Search
  CPC ............... C30B 25/02; H01L 29/66795; H01L 21/02271; H01L 21/02381; H01L 21/02532; H01L 21/2053

(Continued)

(56) References Cited

U.S. PATENT DOCUMENTS 5,926,722 A    7/1999  Jang et al.
5,963,811 A   10/1999  Chern
(Continued)

OTHER PUBLICATIONS

Akarvardar et al., "Bulk FINFET with Partial Dielectric Isolation Feature a Punch-Through Stopping Layer Under the Oxide," U.S. Appl. No. 13/927,698, filed Jun. 26, 2013.
(Continued)

*Primary Examiner* — Marcos D Pizarro
(74) *Attorney, Agent, or Firm* — Wayne F. Reinke, Esq.; Heslin Rothenberg Farley & Mesiti P.C.

(57) ABSTRACT

A semiconductor stack of a FinFET in fabrication includes a bulk silicon substrate, a selectively oxidizable sacrificial layer over the bulk substrate and an active silicon layer over the sacrificial layer. Fins are etched out of the stack of active layer, sacrificial layer and bulk silicon. A conformal oxide deposition is made to encapsulate the fins, for example, using a HARP deposition. Relying on the sacrificial layer having a comparatively much higher oxidation rate than the active layer or substrate, selective oxidization of the sacrificial layer is performed, for example, by annealing. The presence of the conformal oxide provides structural stability to the fins, and prevents fin tilting, during oxidation. Selective oxidation of the sacrificial layer provides electrical isolation of the top active silicon layer from the bulk silicon portion of the fin, resulting in an SOI-like structure. Further fabrication may then proceed to convert the active layer to the source, drain and channel of the FinFET. The oxidized sacrificial layer under the active channel prevents punch-through leakage in the final FinFET structure.

9 Claims, 2 Drawing Sheets

(58) Field of Classification Search
USPC .......................... 438/151, 164; 257/E21.102
See application file for complete search history.

(56) References Cited

U.S. PATENT DOCUMENTS

| | | | |
|---|---|---|---|
| 6,635,543 | B2 | 10/2003 | Furukawa et al. |
| 7,871,873 | B2 | 1/2011 | Maszara et al. |
| 7,888,273 | B1 | 2/2011 | Wang et al. |
| 8,048,723 | B2 * | 11/2011 | Chang et al. ............... 438/135 |
| 8,866,204 | B2 * | 10/2014 | Liu et al. ................. 257/288 |
| 9,093,496 | B2 | 7/2015 | Jacob et al. |
| 9,224,865 | B2 | 12/2015 | Akarvardar et al. |
| 9,349,730 | B2 | 5/2016 | Jacob et al. |
| 2004/0063286 | A1 | 4/2004 | Kim et al. |
| 2005/0239242 | A1 | 10/2005 | Zhu et al. |
| 2006/0071213 | A1 | 4/2006 | Ma et al. |
| 2007/0000897 | A1 | 1/2007 | Ingle et al. |
| 2007/0090443 | A1 | 4/2007 | Choi et al. |
| 2007/0102834 | A1 | 5/2007 | Enicks et al. |
| 2007/0249174 | A1 | 10/2007 | Yang |
| 2007/0272954 | A1 | 11/2007 | Chen et al. |
| 2008/0128796 | A1 | 6/2008 | Zhu et al. |
| 2010/0163971 | A1 | 7/2010 | Hung et al. |
| 2012/0168913 | A1 | 7/2012 | Toh et al. |
| 2013/0026539 | A1 | 1/2013 | Tang et al. |
| 2013/0181263 | A1 | 7/2013 | Cai et al. |
| 2013/0244387 | A1 | 9/2013 | Cho |
| 2013/0330889 | A1 | 12/2013 | Yin et al. |
| 2014/0061734 | A1 | 3/2014 | Basker et al. |
| 2014/0103451 | A1 | 4/2014 | Ouyang et al. |
| 2014/0124842 | A1 | 5/2014 | Wang et al. |
| 2014/0124863 | A1 | 5/2014 | Cheng et al. |
| 2014/0159123 | A1 | 6/2014 | Cheng et al. |
| 2014/0167163 | A1 | 6/2014 | Cheng et al. |
| 2014/0191296 | A1 | 7/2014 | Bergendahl et al. |
| 2014/0252497 | A1 | 9/2014 | Peng et al. |
| 2015/0001591 | A1 | 1/2015 | Akarvardar et al. |
| 2015/0021663 | A1 | 1/2015 | Akarvardar et al. |
| 2015/0021690 | A1 | 1/2015 | Jacob et al. |
| 2015/0021691 | A1 | 1/2015 | Akarvardar et al. |
| 2015/0021709 | A1 | 1/2015 | Jacob et al. |
| 2015/0024572 | A1 | 1/2015 | Jacob et al. |

OTHER PUBLICATIONS

Akarvardar et al., Office Action for U.S. Appl. No. 13/945,627, filed Jul. 18, 2013 (U.S. Patent Application Publication No. 2015/0021663 A1), dated Jul. 11, 2014.

Akarvardar et al., Final Office Action for U.S. Appl. No. 13/945,627, filed Jul. 18, 2013 (U.S. Patent Application Publication No. 2015/0021663 A1), dated Jan. 21, 2015.

Akarvardar et al., Office Action for U.S. Appl. No. 13/945,627, filed Jul. 18, 2013 (U.S. Patent Application Publication No. 2015/0021663 A1), dated Mar. 20, 2015.

Jacob et al., Office Action for U.S. Appl. No. 13/945,379, filed Jul. 18, 2013 (U.S. Patent Application Publication No. 2015/0021709 A1), dated Sep. 8, 2014.

Jacob et al., Office Action for U.S. Appl. No. 13/945,415, filed Jul. 18, 2013 (U.S. Patent Application Publication No. 2015/0021690 A1), dated Jun. 12, 2014.

Akarvardar et al., Office Action for U.S. Appl. No. 13/927,698, filed Jun. 26, 2013 (U.S. Patent Application Publication No. 2015/0001591 A1), dated Sep. 2, 2014.

Akarvardar et al., Office Action for U.S. Appl. No. 13/927,698, filed Jun. 26, 2013 (U.S. Patent Application Publication No. 2015/0001591 A1), dated Oct. 20, 2014.

Akarvardar et al., Office Action for U.S. Appl. No. 13/927,698, filed Jun. 26, 2013 (U.S. Patent Application Publication No. 2015/0001591 A1), dated Feb. 24, 2015.

Akarvardar et al., Final Office Action for U.S. Appl. No. 13/927,698, filed Jun. 26, 2013 (U.S. Publication No. 2015/0001591 A1), dated Jul. 27, 2015.

Jacob et al., Ofice Action for U.S. Appl. No. 13/945,415, filed Jul. 18, 2013 (U.S. Publication No. 2015/0021690 A1), dated Mar. 31, 2015.

Jacob et al., Office Action for U.S. Appl. No. 13/945,379, filed Jul. 18, 2013 (U.S. Publication No. 2015/0021709 A1), dated May 6, 2015.

Akarvardar et al., Final Office Action for U.S. Appl. No. 13/945,627, filed Jul. 18, 2013 (U.S. Publication No. 2015/0021663 A1), dated Jul. 14, 2015.

Jacob et al., Office Action dated Oct. 2, 2015 for U.S. Appl. No. 13/945,379, filed Jul. 18, 2013 (U.S. Publication No. 2015/0021709 A1).

Jacob et al., Office Action dated Nov. 17, 2014 for U.S. Appl. No. 13/945,445, filed Jul. 18, 2013 (U.S. Publication No. 2015/0024572 A1).

Xu, Nuo, "Effectiveness of Strain Solutions for Next-Generation MOSFETs," Doctor of Philosophy Dissertation, Engineering—Electrical Engineering and Computer Sciences, Graduate Division, University of California, Berkeley, 2012, 103 pages.

Jacob et al., Office Action dated Nov. 9, 2015, for U.S. Appl. No. 13/945,415, filed Jul. 18, 2013 (U.S. Patent Publication No. 2015/0021690 A1).

Akarvardar et al., Office Action dated Oct. 21, 2015, for U.S. Appl. No. 13/945,698, filed Jul. 26, 2013 (U.S. Patent Publication No. 2015/0001591 A1).

Akarvardar et al., Notice of Allowance dated Sep. 23, 2015, for U.S. Appl. No. 13/945,627, filed Jul. 18, 2013 (U.S. Patent Publication No. 2015/0021663 A1).

Jacob et al., Notice of Allowance dated Apr. 21, 2015, for U.S. Appl. No. 13/945,445, filed Jul. 18, 2013 (U.S. Patent Publication No. 2015/0024572 A1).

Ku, Nuo, "Effectiveness of Strain Solutions for Next-Generation MOSFETs," University of California, Berkeley, Spring 2012, pp. 1-35.

Jacob et al., Final Office Action dated Jul. 19, 2016, for U.S. Appl. No. 13/945,379, filed Jul. 18, 2013 (U.S. Patent Application Publication No. 2015/0021709 A1).

Jacob et al., Notice of Allowance dated Feb. 16, 2016, for U.S. Appl. No. 13/945,415, filed Jul. 18, 2013 (U.S. Patent Application Publication No. 2015/0021690 A1).

Jacob et al., Office Action dated Nov. 9, 2015, for U.S. Appl. No. 13/945,415, filed Jul. 18, 2013 (U.S. Patent Application Publication No. 2015/0021690 A1).

* cited by examiner

ELECTRICAL ISOLATION OF FINFET ACTIVE REGION BY SELECTIVE OXIDATION OF SACRIFICIAL LAYER

BACKGROUND OF THE INVENTION

Technical Field

The present invention generally relates to semiconductor transistors. More particularly, the present invention relates to fabricating a FinFET on a bulk semiconductor substrate with a dielectric layer directly under the active region.

Background Information

Fin field-effect transistors (FinFET) devices have been developed to replace conventional planar bulk MOSFETs in advanced CMOS technology due to their improved short-channel effect immunity and $I_{on}/I_{off}$ ratio. However, a problem with bulk FinFET devices is that a leakage path from source to drain exists through a portion of the fin not covered by the gate, but lies below the channel. The leakage of current from source to drain through the lower (un-gated) part of the fin, commonly known as punch-through leakage, causes an increase of static power consumption which is undesirable in modern submicron devices.

In one solution, punch-through leakage in submicron semiconductor devices is sought to be controlled by implanting a punch-through-stopper (PTS) dopant in a portion of the fin directly below the channel. However, the impurities doped by the punch-through-stopper (PTS) implantation may diffuse into the channel region, increasing the variability due to random dopant fluctuation (RDF) and lowering the carrier mobility of the channel region.

Thus there continues to be a need for a solution to the punch-through leakage problem.

SUMMARY OF THE INVENTION

The shortcomings of the prior art are overcome and additional advantages are provided through the provision, in one aspect, of a method of electrically isolating the active region of a fin of a FinFET from the inactive region of the fin therebelow. The method includes providing a semiconductor stack, the stack including a semiconductor substrate of a bulk semiconductor material. The stack further includes an oxidizable layer over the substrate, and an active semiconductor layer over the oxidizable layer, the oxidizable layer being substantially more susceptible to oxidation than the active layer and the semiconductor substrate. The method further includes etching the semiconductor stack to create at least one fin, each fin including a portion of the active layer, a portion of the oxidizable layer and a portion of the substrate, and electrically isolating the active layer of the at least one fin by converting the oxidizable layer to a dielectric layer, resulting in a semiconductor structure, the converting of the oxidizable layer resulting in a converted layer, the converting including selectively oxidizing the oxidizable layer of the at least one fin while providing direct physical support for the oxidizable layer, an entirety of the converted layer remaining after the converting.

The present invention provides, in a second aspect, a semiconductor stack, the stack including a bulk semiconductor material, and at least one fin coupled to the semiconductor substrate and including an active region, an inactive region, and a separation region directly below the active region and above the inactive region, each separation region including at least one dielectric material.

The present invention provides, in a third aspect, a transistor, including a bulk semiconductor substrate, and at least one fin. The at least one fin includes a first region, including a source, a drain, and a channel between the source and the drain. The at least one fin further includes a second region, including at least one dielectric material directly below the first region, and a third region below the second region and coupled to the substrate.

These, and other objects, features and advantages of this invention will become apparent from the following detailed description of the various aspects of the invention taken in conjunction with the accompanying drawings.

DETAILED DESCRIPTION OF THE INVENTION

Figure 1:
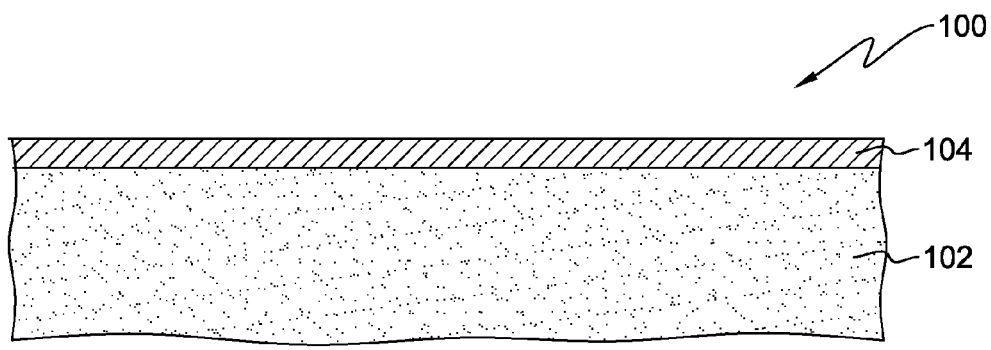
FIG. 1 depicts one example of a semiconductor stack comprising an epitaxial growth of silicon germanium over a bulk silicon substrate, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 illustrates a simplified view of a structure, generally denoted by 100, obtained during an intermediate stage of semiconductor fabrication. At the stage of fabrication depicted in FIG. 1, the semiconductor stack 100, includes a semiconductor substrate 102 of bulk semiconductor material, for example, bulk silicon. A sacrificial layer 104, including a selectively oxidizable material, may be formed over the substrate 102. In one example, the sacrificial layer 104 may include a layer of silicon germanium, which may be expressed as $Si_{1-x}Ge_x$ wherein x, the atomic percentage of germanium in silicon, may be less than or substantially equal to about 1, although the atomic percentage is preferred to be about 0.3 to about 0.7 in the present example. In a specific example, the atomic percentage of germanium present in the layer of silicon germanium may be about 0.5. The silicon germanium sacrificial layer 104, may be formed, for example, by various epitaxial growth processes such as ultra-high vacuum chemical vapor deposition (UHV-CVD), low-pressure CVD(LPCVD), reduced-pressure CVD (RP-CVD), rapid thermal CVD (RTCVD) and molecular beam epitaxy (MBE). In one example, the CVD-based epitaxial growth may take place at a temperature of between about 400° C. to about 1100° C., while the molecular beam epitaxy may typically utilize a lower temperature. In a specific example, the selective epitaxial growth of silicon germanium layer may be performed using halogermanes and silanes as the source gases at temperatures below 600° C. The silicon germanium sacrificial layer 104 may have a thickness preferably, of about 20 nanometers to about 100 nanometers, depending on the metastable thickness of the $Si_{1-x}Ge_x$ layer.

Figure 2:
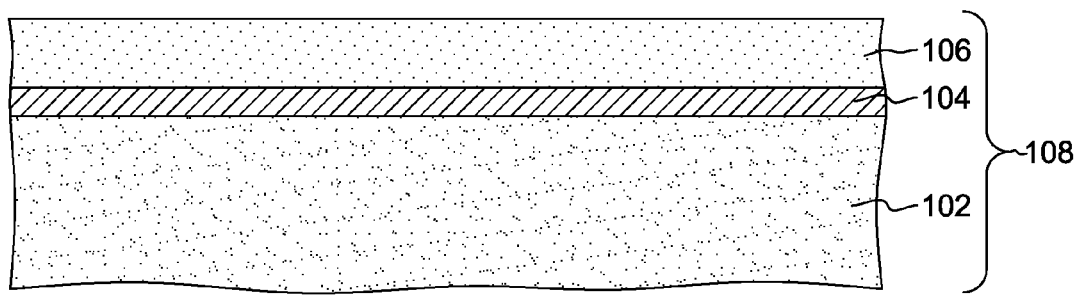
FIG. 2 depicts the stack of FIG. 1 after an epitaxial growth of single crystalline silicon over the layer of silicon germanium, in accordance with one or more aspects of the present invention.

In one example, a selective epitaxial growth process may then be used to form an active layer 106 over the sacrificial layer 104, as illustrated in FIG. 2, where the active layer 106 would eventually become a channel area in subsequent processing steps. In a preferred example, the material of the active layer 106 may be same as the material of the substrate 102. Further, it may noted that the material of the sacrificial layer, such as, for example, silicon germanium, is substantially more susceptible to oxidation than the active layer or the substrate, due to the high oxidation rate of the silicon germanium layer as compared to the oxidation rate of the silicon present in the active region and the bulk semiconductor substrate. This difference effectively allows selective oxidation of the sacrificial layer without damage to the active region or substrate. The epitaxial growth of the active layer 106 over the sacrificial layer 104 results in a multilayer stacked structure 108, which growth may stem from processes such as CVD or MBE to form the active layer 106, the thickness of which may preferably be about 10 nanometers to about 50 nanometers. In a specific example, the thickness of the active layer 106 may be about 30 nanometers. In one example, the active layer 106, such as a layer of silicon, may be grown by flowing a reactant gas, such as dichlorosilane $SiH_2Cl_2$, trichlorosilane $SiHCl_3$, silicontetrachloride $SiCl_4$ or silane $SiH_4$ together with a carrier gas such as hydrogen gas to form a uniform silicon layer 106.

Figure 3:
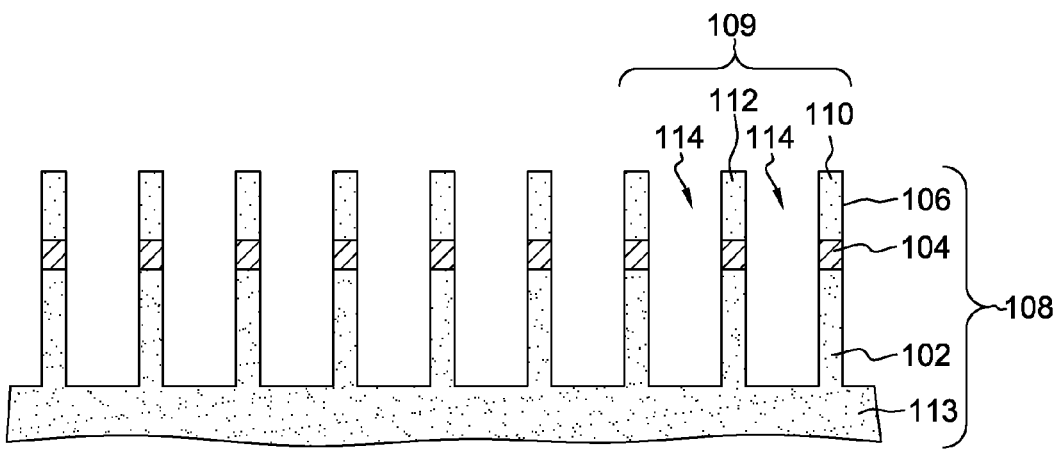
FIG. 3 depicts the structure of FIG. 2 after an anisotropic etching of the multilayer stacked structure into a plurality of fins, in accordance with one or more aspects of the present invention.

The multilayer stacked structure 108 may be etched through the active layer 106 and through the sacrificial layer 104 and into a portion of the bulk silicon substrate 102 to create one or more fins 109, e.g., fins 110 and 112, above a bottom portion 113 of the bulk semiconductor material, as depicted in FIG. 3. The etching process may be performed using any suitable etching process, such as anisotropic dry etching process, for example, reactive-ion-etching (RIE) in sulfur hexafluoride ($SF_6$). In one example, the resulting fins each include a portion of the active layer 106, a portion of the sacrificial layer 104 and a portion of the substrate 102 separated by openings 114. In a specific example, the silicon active layer 106 of a fin has a height of about 30 nanometers, the silicon germanium sacrificial layer 104 has a height of about 25 nanometers, and the fin portion of the bulk silicon substrate 102 has a height of about 100 nanometers.

Next, the invention seeks to selectively oxidize the silicon germanium sacrificial layer portion of the fins. In one example, encapsulating the entire fin with an oxide and subjecting it to a prolonged thermal anneal enables the selective oxidation of silicon-germanium. In this anneal-only case, the oxygen required for the oxidation is supplied by the encapsulating oxide. In another example, oxidation is accomplished with a prolonged annealing process in the presence of oxygen. Oxidizing the sacrificial layer of a fin converts the sacrificial layer to a dielectric, effectively electrically isolating the active region of the fin, which in subsequent processing, will become the source, drain and channel, from the rest of the fin below. In the present example, the fins etched out of the multilayer stacked structure may be encapsulated in an oxide layer, for example, a High Aspect Ratio Process (HARP) involving $O_3$ in the presence of tetraethyl orthosilicate (TEOS) to oxidize the silicon germanium layer into an oxide. When the anneal process is long enough, the sacrificial SiGe layer transforms into an $SiO_2$ layer. In this ideal scenario, Ge atoms are uniformly distributed to the newly formed $SiO_2$ as well as into the HARP oxide. Some Ge diffusion into the active Si layer above and supporting Si layer below may also take place. Otherwise, if the oxidation or anneal process is not long enough, Ge may remain under the active channel to create a dielectric matrix, for instance, in the form of nanocrystals. Preferably, Ge nanocrystals under the channel is avoided, as it can lead to a leakage path from transistor source to drain. See the discussion below of FIG. 6 for further details.

Figure 4:
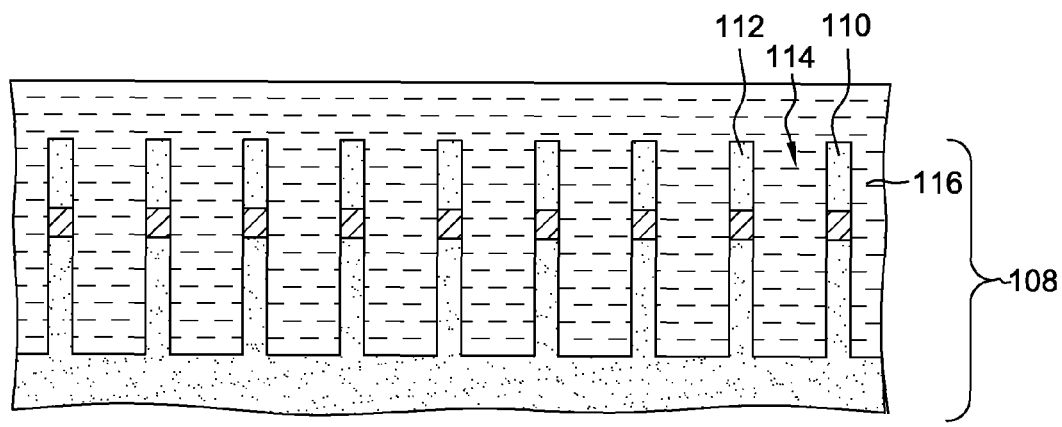
FIG. 4 depicts the structure of FIG. 3 after a conformal deposition of a $SiO_2$ layer over the plurality of fins, in accordance with one or more aspects of the present invention.

Accordingly, referring to FIG. 4, the fins, e.g., fins 110 and 112, are surrounded with an oxide 116 deposited, for example, by a High Aspect Ratio Process (HARP). In one example, the HARP may include using an O3/tetraethyl orthosilicate (TEOS) based sub-atmospheric chemical vapor deposition (SACVD) fill process to result in a conformal deposition of silicon oxide. HARP depositions may be advantageous for gapfill depositions of openings with high aspect ratios and may include both a slower deposition rate stage when the slower rate is advantageous for reducing defects, and a higher deposition rate stage when the high rate results in shorter deposition times.

Figure 5:
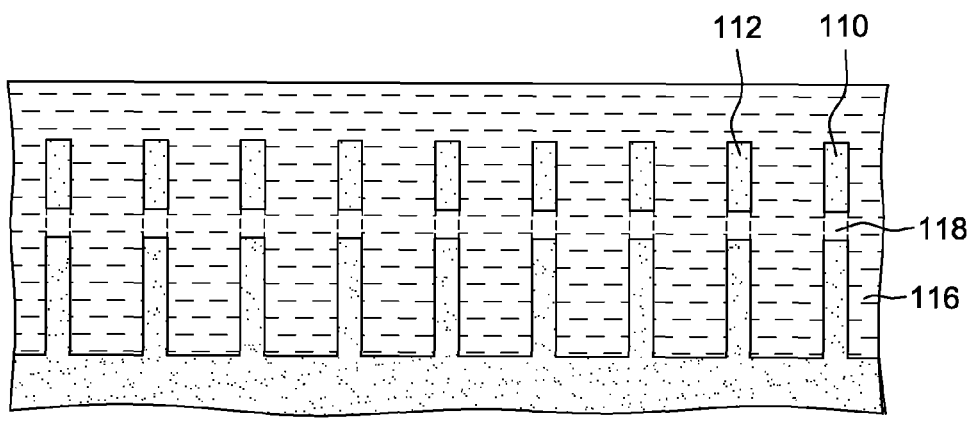
FIG. 5 depicts the structure of FIG. 4 after an oxidation from a high temperature anneal of the structure, resulting in the oxidation of the silicon germanium layer, in accordance with one or more aspects of the present invention.

As depicted in FIG. 5, after the HARP deposition, the fins in the present example are subjected to a selective oxidation process in the presence of the HARP oxide layer 116 to form a layer of thermal oxide 118 by selectively oxidizing the sacrificial layer 104. The selective oxidation process may be performed, for example, by subjecting the HARP oxide to a rapid thermal oxidation (RTO) procedure or by subjecting to a steam annealing procedure. It may be noted that performing the selective oxidation, for example, by annealing the sacrificial layer 104 in the presence of the HARP oxide encapsulating the fins, electrically isolates the active layer by converting the sacrificial layer to a dielectric layer, while also providing mechanical/physical stability to the fin structure and preventing the fin structure from tilting due to stress caused by the oxidation of the SiGe layer. There are many different scenarios and time/temperature combinations that would achieve the oxidation. In one example, the rapid thermal oxidation may be performed at about 900° C. for about 15 seconds. In another example, steam annealing may be performed in the presence of water vapor at about 500° C. for about 6 hours.

Figure 6:
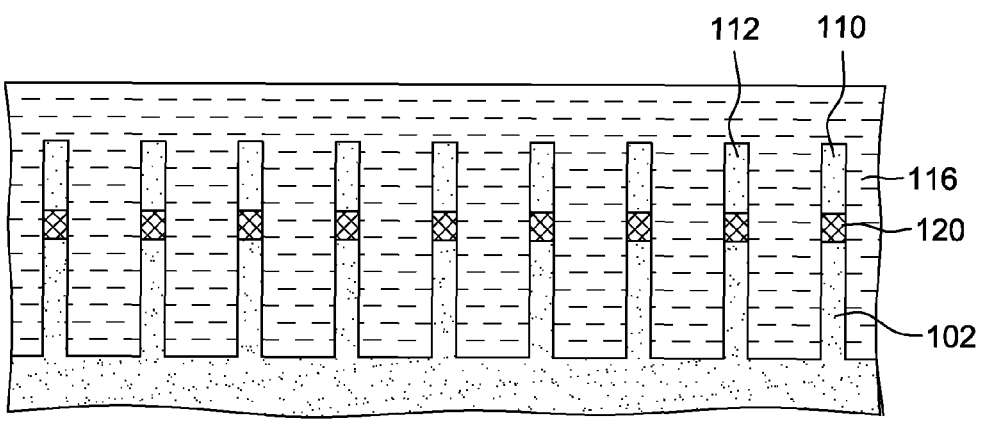
FIG. 6 depicts the structure of FIG. 5 after the partial oxidation of the silicon germanium layer, in accordance with one or more aspects of the present invention.

As noted above, it may be the case that annealing the oxidizable material of the sacrificial layer fails to completely oxidize the material, in this example, silicon germanium. In that case, as shown in FIG. 6, germanium 120 may be dispersed in that region of the fin, now an oxide, to create a dielectric matrix. Note that the dielectric material may include one material, a material with one or more impurities, an alloy or an alloy with one or more impurities. Note also that the dielectric matrix includes a dielectric material having one or more impurities as well as alloys along with the existing doping material. In a specific example, the sacrificial layer includes at least one dielectric material such as, for example, silicon dioxide, germanium, germanium oxide, germanium crystals, and germanium crystals uniformly dispersed within silicon dioxide. The dispersed germanium may take the form of, for example, germanium nanocrystals. As one would expect, the more germanium that remains in the fin, the higher the likelihood of reducing the level of electrical isolation. Hence, coming as close as possible to full oxidation is preferred.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a semiconductor stack, comprising:
a semiconductor substrate, comprising a bulk semiconductor material;
an oxidizable layer over the substrate; and
an active semiconductor layer over the oxidizable layer, wherein the oxidizable layer is substantially more susceptible to oxidation than the active layer and the semiconductor substrate;
etching the semiconductor stack to create at least one fin, each fin comprising a portion of the active layer, a portion of the oxidizable layer and a portion of the substrate; and
electrically isolating the active layer of the at least one fin by converting the oxidizable layer to a dielectric layer, resulting in a semiconductor structure, wherein the converting of the oxidizable layer results in a converted layer, wherein the converting comprises selectively oxidizing the oxidizable layer of the at least one fin while providing direct physical support for the oxidizable layer, and wherein an entirety of the converted layer remains after the converting.

2. The method of claim 1, comprising further processing the semiconductor structure into a FinFET after the selective oxidation, wherein the active layer comprises a source, a drain and a channel between the source and the drain.

3. The method of claim 1, wherein the providing comprises epitaxially growing the oxidizable layer.

4. The method of claim 3, wherein the epitaxially growing comprises using a chemical vapor deposition (CVD) based process, and wherein the converting comprises annealing at a temperature of about 400° C. to about 1100° C.

5. The method of claim 1, wherein the selectively oxidizing comprises:
conformally depositing an oxide so as to encapsulate the at least one fin; and
annealing the at least one fin and conformal oxide to locally oxidize the oxidizable layer therein, wherein the conformal oxide provides structural stability for and prevents tilting of the at least one fin during the local oxidation.

6. The method of claim 5, wherein the oxidizable material of the oxidizable layer comprises silicon germanium $Si_{(1-x)}Ge_x$, wherein $0<x\leq1$, and wherein the dielectric comprises an oxide.

7. The method of claim 6, wherein the semiconductor substrate and the active layer comprise silicon.

8. The method of claim 6, wherein $0.3\leq x\leq0.7$.

9. The method of claim 8, wherein x is about 0.5.

* * * * *